United States Patent [19]
Deguchi et al.

[11] Patent Number: 5,665,167
[45] Date of Patent: Sep. 9, 1997

[54] PLASMA TREATMENT APPARATUS HAVING A WORKPIECE-SIDE ELECTRODE GROUNDING CIRCUIT

[75] Inventors: Yoichi Deguchi, Machida; Satoru Kawakami, Sagamihara; Shiro Koyama, Fuchu; Kenji Ishikawa, Sagamihara, all of Japan

[73] Assignee: Tokyo Electron Kabushiki Kaisha, Japan

[21] Appl. No.: 194,665

[22] Filed: Feb. 14, 1994

[30] Foreign Application Priority Data

| Feb. 16, 1993 | [JP] | Japan | 5-049995 |
| Feb. 16, 1993 | [JP] | Japan | 5-049997 |
| May 17, 1993 | [JP] | Japan | 5-139157 |

[51] Int. Cl.$^6$ ............... C23C 16/00; C23F 1/02; H05H 1/00

[52] U.S. Cl. ............... 118/728; 118/723 R; 118/723 E; 118/723 I; 118/723 MA; 156/345; 315/111.21; 315/111.31; 315/111.51; 427/488; 427/535; 427/569; 427/571

[58] Field of Search ............... 118/723 R, 723 E, 118/723 MA, 728, 723 I; 156/345; 204/298.08, 298.03, 298.32; 315/111.21, 111.31, 723 I; 427/569–580, 535–539, 488–491

[56] References Cited

U.S. PATENT DOCUMENTS

| 3,767,551 | 10/1973 | Lang | 204/192 |
| 4,316,791 | 2/1982 | Taillet | 204/298 |
| 4,352,725 | 10/1982 | Tsukada | 204/192 E |
| 4,682,566 | 7/1987 | Aitken | 118/724 |
| 4,826,585 | 5/1989 | Davis | 204/298 |
| 4,838,978 | 6/1989 | Sekine | 156/345 |
| 4,908,095 | 3/1990 | Kagatsume | 156/643 |
| 4,931,135 | 6/1990 | Horiuchi | 156/643 |
| 5,147,493 | 9/1992 | Nishimura | 156/345 |
| 5,213,650 | 5/1993 | Wang | 156/345 |
| 5,226,056 | 7/1993 | Kikuchi | 373/18 |
| 5,250,137 | 10/1993 | Arami | 156/345 |
| 5,255,153 | 10/1993 | Nozawa et al. | 361/234 |
| 5,275,683 | 1/1994 | Arami et al. | 156/643 |
| 5,346,578 | 9/1994 | Benzing | 156/345 |
| 5,380,566 | 1/1995 | Robertson | 427/534 |
| 5,382,311 | 1/1995 | Ishikawa | 156/345 |
| 5,436,528 | 7/1995 | Paranjpe | 315/111.51 |

FOREIGN PATENT DOCUMENTS

| 5539 | 11/1985 | Japan | 156/345 R |
| 10239 | 1/1986 | Japan | 156/345 R |
| 239620 | 10/1986 | Japan | 118/723 E |
| 283934 | 11/1989 | Japan | 204/298.32 |
| 202025 | 8/1990 | Japan | 118/723 E |
| 241034 | 9/1990 | Japan | 156/345 RM |
| 290970 | 11/1990 | Japan | 204/298.03 |
| 26781 | 1/1992 | Japan | 204/298.32 |
| 5-291194 | 11/1993 | Japan . | |

*Primary Examiner*—R. Bruce Breneman
*Assistant Examiner*—Jeffrie R. Lund
*Attorney, Agent, or Firm*—Beveridge, DeGrandi, Weilacher & Young, L.L.P.

[57] ABSTRACT

A static chuck and a workpiece push-up pin are disposed on a susceptor which is one of opposed electrodes generating plasma. The push-up pin and the susceptor are electrically connected. A grounding circuit which discharges electric charges remaining on the susceptor is disposed in parallel with an RF power supply circuit which supplies RF power to the susceptor. Thus, electric charges remaining in the power supply circuit can be discharged and an abnormal discharging between the push-up pin and the susceptor can be prevented.

13 Claims, 7 Drawing Sheets

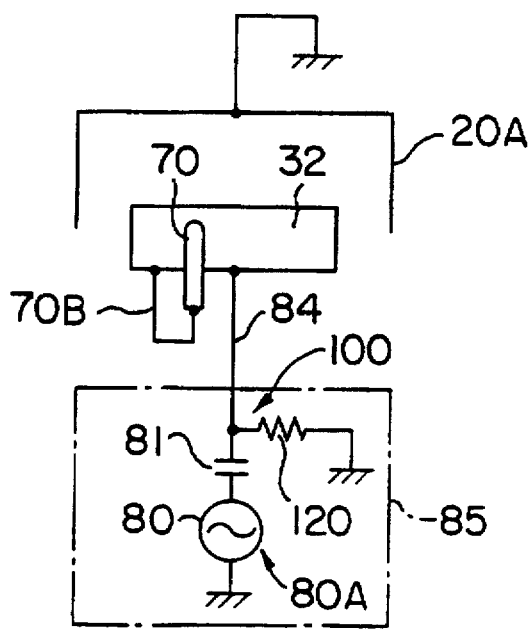
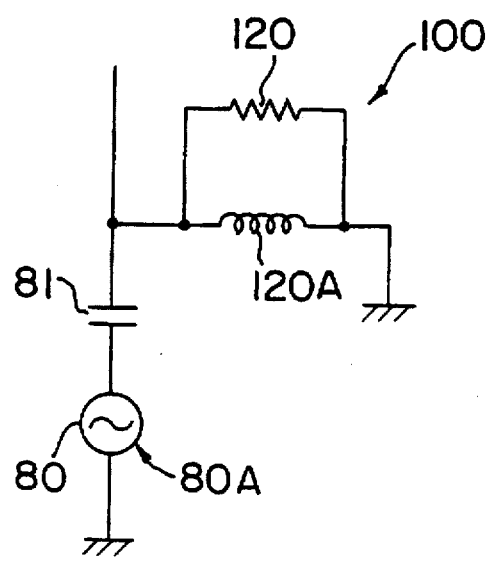
FIG. 2A  FIG. 2B
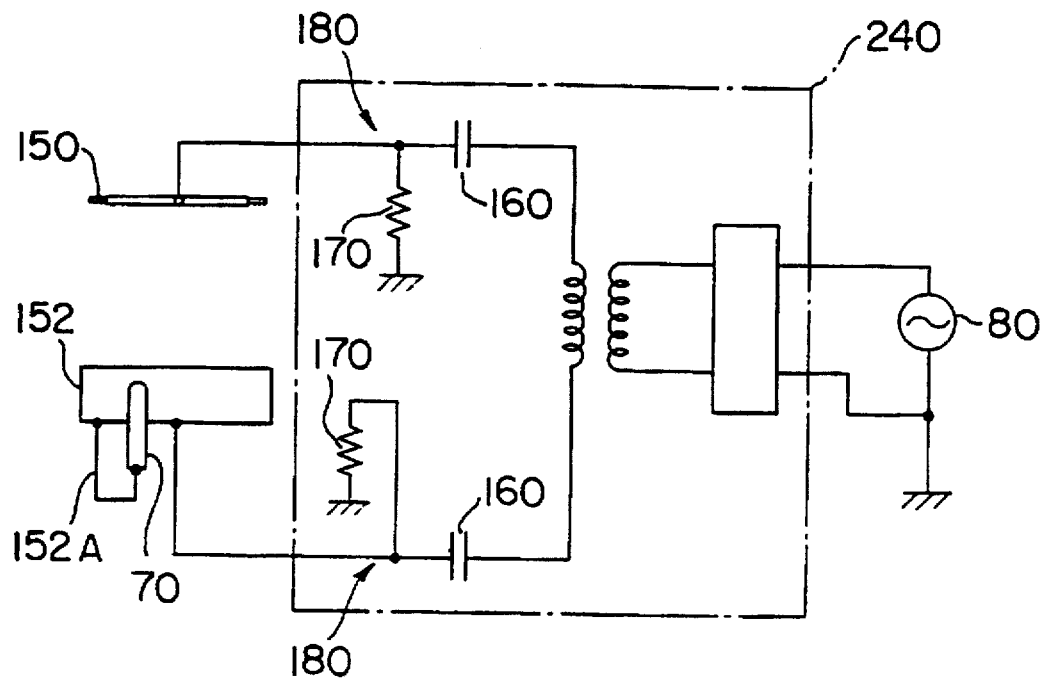
FIG. 3

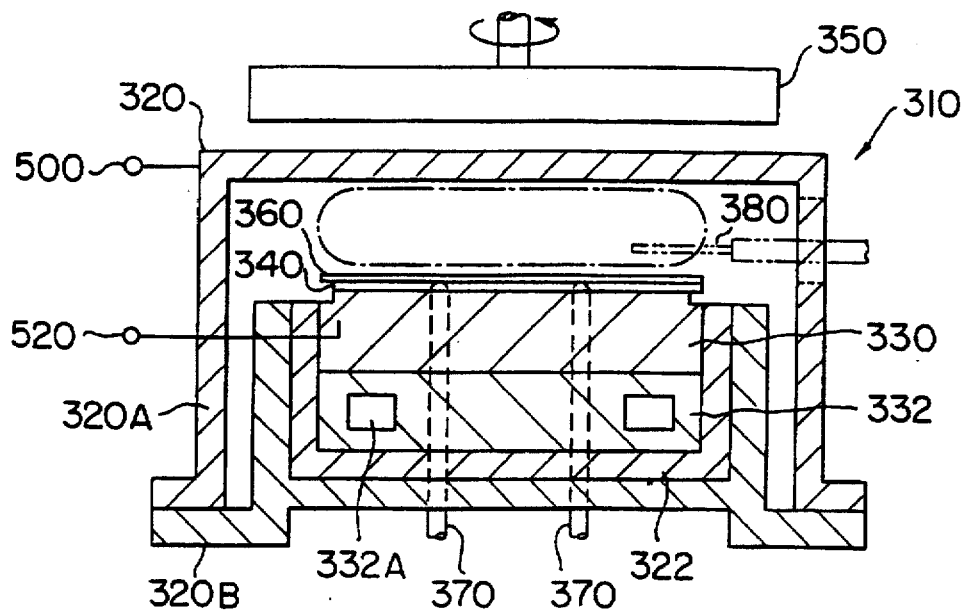
F I G. 7
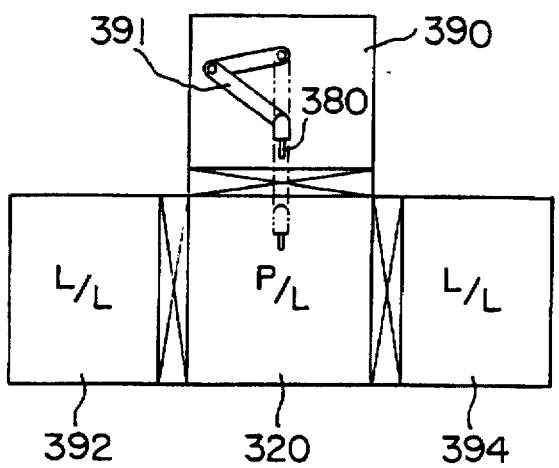
F I G. 8
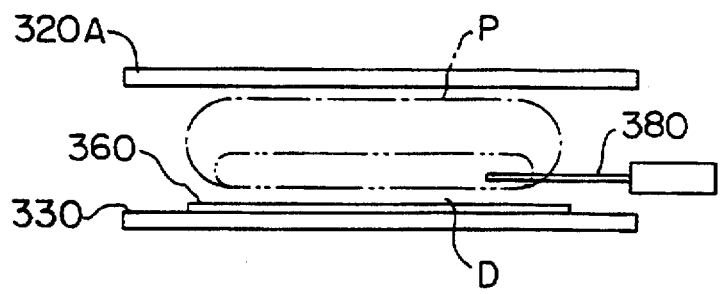
F I G. 9

PLASMA TREATMENT APPARATUS HAVING A WORKPIECE-SIDE ELECTRODE GROUNDING CIRCUIT

BACKGROUND OF THE INVENTION

1. Field of the Invention

The present invention relates to a plasma treatment apparatus for accurately treating a workpiece such as a semiconductor wafer with plasma.

2. Description of the Related Art

In a semiconductor device manufacturing process using a plasma treatment apparatus that performs a plasma-etching treatment, a workpiece such as a semiconductor wafer to be treated with plasma should be kept at a predetermined position. For example, in the case of a planar plasma treatment apparatus that performs a plasma etching treatment in vacuum atmosphere, a workpiece is secured to a static chuck on a susceptor disposed on one of opposed electrodes.

A voltage is applied between a workpiece and an electrode which are opposed to each other with an insulation layer, positive and negative electric charges take place between the workpiece and the electrode and thereby Coulomb' force works therebetween. Thus, with the Coulomb' force, the static chuck attracts and holds the workpiece.

As such a static chuck, an insulating static attracting sheet may be disposed between a metal chuck and a workpiece. The static attracting sheet may be constructed by sandwiching a conductor such as copper with two sheets of insulating material such as polyimide.

In such a static chuck, when plasma generation is turned off after plasma treatment is completed, electric charges do not flow from the static chuck. Thus, a so-called float electrode is formed on the static chuck side. Consequently, electric charges stop flowing to the opposed electrode through plasma. As a result, the static chuck side is charged with residual electric charges. The electric charges on he static chuck side induce residual electric charges on the workpiece.

Before the workpiece is unloaded, the electric charges charged on the workpiece should be eliminated so as to easily unload the workpiece. As a conventional construction, conductive pusher pins which push up the workpiece and thereby detach it from the static chuck are provided. The pusher pins are made of a conductive material and are connected to a grounding circuit through a switch. In his construction, when the workpiece is pushed up, by turning on the switch, the electric charges on the workpiece can be eliminated.

However, when the electric charges on the workpiece are eliminated, the following problem takes place.

When the switch is turned on and off while the pusher pins are being pushed up, noise tends to take place due to discharging of the electric charges. In other words, when the switch is turned off, since the pusher pins are electrically kept in a floating state, if the density of electric charges charged on the workpiece is high, electric charges are discharged. In addition, when a grounding circuit, which is connected to the pusher pins, is provided, the construction becomes complicated.

To simplify the construction, a circuit which directly grounds a resistor or a coil instead of the above-mentioned switch may be constructed.

However, in such a construction, noise cannot be eliminated. The inventor of the present invention has found that noise is induced by a potential between the pusher pins and the susceptor.

In other words, a circuit that supplies an RF power to the susceptor is provided with for example a condenser that prevents a DC current from flowing to the power supply. In this case, the condenser or storage capacitance of the power supply circuit itself serves as an insulator in DC. When the supply of the RF power is stopped, electric charges that can sufficiently charge the susceptor may remain in the condenser or the circuit. Thus, when the pusher pins are grounded, a potential tends to take place between the pusher pin side and the susceptor. Thus, an abnormal discharging will take place, which is a cause of noise.

When residual charges remain on the susceptor side, even if the power to the static chuck is turned off, the workpiece is attracted to the susceptor side by a static induction. Thus, the workpiece is not easily peeled off from the static chuck. If the workpiece is attempted to be forcefully peeled off, it will be damaged.

SUMMARY OF THE INVENTION

The present invention has been made from the above-mentioned point of view. An object of the present invention is to provide a plasma treatment apparatus that can prevent an abnormal discharging from taking place between a workpiece push-up member and a workpiece holding table and prevent the workpiece from being clogged and that can be simply constructed.

A first aspect of the present invention is a plasma treatment apparatus, comprising a chamber, a plasma generating means for generating plasma in the chamber, a workpiece-side electrode disposed in the chamber for holding a workpiece, and a conductive detaching means straightly penetrating the workpiece-side electrode, after a predetermined treatment is completed, the detaching means being in contact with the workpiece so as to detach the workpiece from the workpiece-side electrode, wherein the detaching means is electrically connected to the workpiece-side electrode, and wherein the workpiece-side electrode is connected to a grounding circuit.

A second aspect of the present invention is a plasma treatment apparatus, comprising a chamber, a plasma generating means for generating plasma in the chamber, a workpiece-side electrode disposed in the chamber for holding a workpiece, a pin straightly penetrating the workpiece-side electrode, after a predetermined treatment is completed, the pin being in contact with the workpiece so as to detach the workpiece from the workpiece-side electrode, and a conductive rubber member disposed at the distal end of the pin, the conductive rubber member having a lower hardness than the workpiece.

A third aspect of the present invention is a plasma treatment apparatus, comprising a chamber, a plasma generating means for generating plasma in the chamber, a workpiece-side electrode disposed in the chamber for holding a workpiece, and a probe movably disposed in the plasma, for scanning the plasma so as to measure plasma parameters.

According to the first aspect of the present invention, since the workpiece-side electrode and the detaching means are electrically connected, the voltage of the detaching means becomes the same as the voltage of the workpiece-side electrode. Thus, the potential between the detaching means and the workpiece-side electrode can be eliminated, thereby preventing an abnormal discharging from taking place therebetween. In addition, since the workpiece-side electrode is connected to the grounding circuit, only electric charges which remain on the workpiece-side electrode can be grounded. Thus, since the voltage of the detaching means becomes equal to the voltage of the workpiece-side electrode, residual electric charges do not take place.

According to the second aspect of the present invention, residual electric charges which reside on the workpiece can flow through the conductive rubber members which are in contact with the rear surface of the workpiece, and therefore the contacting area of the workpiece and the conductive rubber members becomes large. Thus, since the contacting resistance between the workpiece and the conductive rubber members decreases, residual electric charges which remain on the workpiece easily flow through the conductive pins being grounded.

According to the third aspect of the present invention, with the probe which movably scans the plasma, the plasma parameters can be measured.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 2A is a circuit diagram schematically showing the principal portions of FIG. 1;

FIG. 2B is a circuit diagram schematically showing a modification of FIG. 2A;

FIG. 3 is a circuit diagram schematically showing a modification of the principal portions of FIG. 1;

FIG. 7 is a sectional view showing a construction of principal portions of a plasma treatment apparatus according to a third embodiment of the present invention;

FIG. 8 is a plan view showing a construction of the principal portions of FIG. 7;

FIG. 9 is a schematic diagram for explaining the relation of positions of a probe for use with the principal portions of FIG. 7 and plasma;

DETAILED DESCRIPTION OF THE PREFERRED EMBODIMENTS

First Embodiment

Next, with reference to FIGS. 1 to 3, a first embodiment of the present invention will be described.

Figure 1:
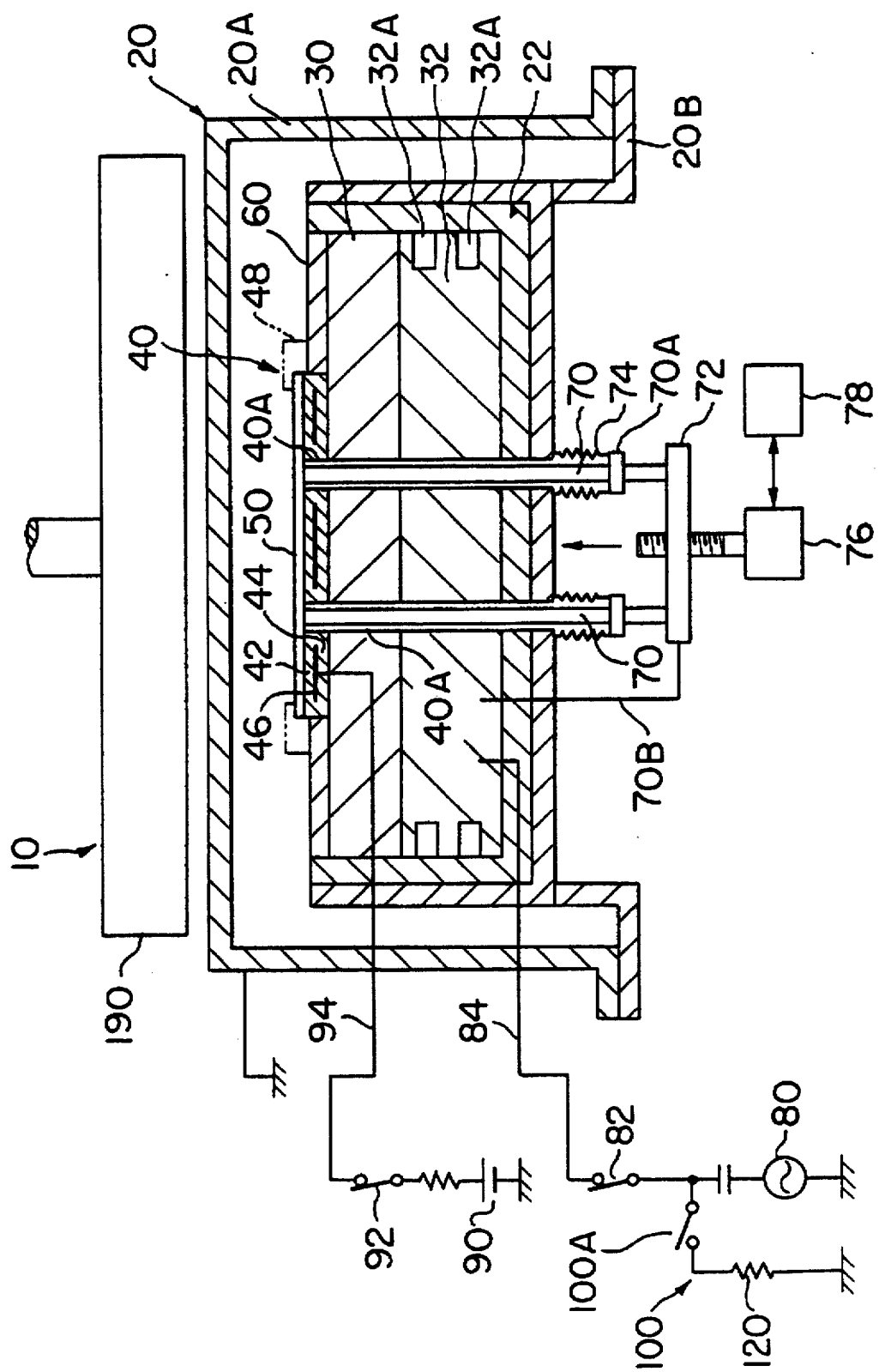
FIG. 1 is a sectional view showing principal portions of a plasma treatment apparatus according to a first embodiment of the present invention.

FIG. 1 is a sectional view showing principal portions of a plasma treatment apparatus according to a first embodiment of the present invention. This embodiment is an RIE type of plasma treatment apparatus where an RF power is supplied to one of opposed electrodes.

The plasma treatment apparatus 10 comprises a chamber 20, a first susceptor 30, a second susceptor 32, and a static chuck 40. The chamber 20 serves as an upper electrode. The first susceptor 30 and the second susceptor 32 serve as a lower electrode.

The chamber 20 is constructed of a cylindrical upper chamber 20A and a cylindrical lower chamber 20B. The bottom of the upper chamber 20A is open. The lower chamber 20B is secured to a lower portion of the upper chamber 20A. The upper chamber 20A and the lower chamber 20B form a space in which a vacuum is created and that is filled with an etching gas. A cylindrical heat insulator 22 is disposed inside the lower chamber 20B. The cylindrical heat insulator 22 has a bottom and is made of ceramics.

The first susceptor 30 and the second susceptor 32 are disposed within the heat insulator 22.

The first susceptor 30 and the second susceptor 32 are layered and made of a conductor such as aluminum, which conducts electricity and heat. A cooling jacket 32A is formed in an outer peripheral portion of the second susceptor 32. A semiconductor wafer 50, which is a workpiece, is cooled at around $-50°$ C. to $-100°$ C. by a coolant that circulates in the cooling 32A through the first susceptor 30 and a static chuck 40 which will be described later.

The static chuck 40 is fixedly placed on the front surface of the first susceptor 30. The static chuck 40 is disposed in a hole defined in a focus ring 60 disposed on the upper surface of the first susceptor 30. The static chuck 40 has upper and lower polyimide sheets 42 and 44 and a conductive sheet 46. The upper and lower polyimide sheets 42 and 44 are insulation layers. The conductive sheet 46 is made of, for example, copper and is sandwiched by the upper and lower polyimide sheets 42 and 44.

A mechanical chuck 48 instead of the static chuck 40 may be provided so as to mechanically hold the semiconductor wafer 50.

Three holes 40A are defined in the static chuck 40. These holes 40A vertically extend and penetrate the static chuck 40 (FIG. 1 shows only two holes). Pusher pins 70 are inserted into the respective holes 40A so as to support and guide the semiconductor wafer 50.

The pusher pins 70 are made of a conductive material. The pusher pins 70 are movably inserted into through-holes defined in the static chuck 40, the first susceptor 30, and the second susceptor 32. When the pusher pins 70 are raised, their upper ends protrude upward from the static chuck 40, thereby pushing up the semiconductor wafer 50. The lower ends of the pusher pins 70 are secured to a lifting plate 72. As the lifting plate 72 vertically moves, the pusher pins 70 vertically move as shown in FIG. 1. In this embodiment, a bellows member 74 is disposed between a lower end 70A of each of the pusher pins 70 and a lower portion of the lower chamber 20B, and therefore the hole 40A of the pusher pin 70 is air-tightly formed against outer air.

The lifting plate 72 which lifts up and down the pusher pins 70 is connected to a pulse motor 76, which is a drive source. The rotating force of the pulse motor 76 is converted into a linear drive force through a transmission member such as a ball screw, so that the lifting plate 72 is lifted up and down. A motor drive portion 78 supplies pulses to the pulse motor 76. The pulse motor 76 rotates corresponding t the pulses received from the motor drive portion 78.

The pusher pins 70 are electrically connected to the second susceptor 32 by a line 70B through the lifting plate 72. The line 70B causes the voltage on a susceptor side (described later) to be equal to the voltage of the pusher pins 70.

As described above, the upper chamber 20A and the lower chamber 20B define the space in which a vacuum can be created and that is filled with an etching gas. This space serves as a plasma treatment space. In this embodiment, the upper chamber 20A is grounded. A power supply line 84 connects an RF power supply (radio frequency power supply) 80 and the first and second susceptors 30 and 32, through a switch 82. In this construction, the RIE type of plasma treatment apparatus is constructed. In addition, since the upper chamber 20A is grounded, it is used as the other electrode of the static chuck. When plasma is generated, the semiconductor wafer 50 can be grounded through the plasma.

A power supply line 94 connects a DC high voltage power supply 90 and the conductive sheet 46 of the static chuck 40 through a switch 92. Thus, he DC high voltage power supply 90 applies a DC voltage of, for example, 2 kV to the conductive sheet 46. Since the high voltage is applied to the conductive sheet 46, a mono-pole type static chuck is formed. Thus, the static chuck 40 can attract and hold the semiconductor wafer 50.

In this embodiment, a permanent magnet 190 is rotatably disposed at an outer upper position of the upper chamber 20A in such a way that the permanent magnet 190 is opposed to the semiconductor wafer 50. By rotating the permanent magnet 190, a magnetic field is generated in parallel with and in the vicinity of the surface of the semiconductor wafer 50. In this manner, a magnetron etching apparatus is constructed.

As described above, the RF power supply 80 supplies the RF power to the second susceptor 32, which is electrically connected to the push pins 70 through the line 70B. The power line 84 is connected to a grounding DC circuit 100 through a switch 100A. The grounding DC circuit 100 grounds electric charges that tend to remain on the susceptor 32.

FIG. 2A schematically shows the grounding circuit 100. In FIG. 2A, the grounding circuit 100 is constructed of a resistor 120 of a self bias measuring circuit in an impedance matching circuit 85 for use with the RF power supply circuit 80A. This resistor 120 serves as a discharging circuit of the condenser 81 and is grounded in the impedance matching circuit 85. The resister 120 grounds only residual electric charges which remain in the condenser 81 or the storage capacitance of the RF power supply circuit 80A rather than the RF power from the RF power supply 80. Thus, in this embodiment, when the impedance of the RF power supply circuit 80A is for example 250 kohms, the impedance of the resistor 120 is determined at least 10 times, preferably 10 to 20 times, as high as the impedance of the RF power supply circuit 80A.

As shown in FIG. 2B, the impedance of the grounding circuit 100 may be formed of the combination of a resistor 120 and a coil 120A. Alternatively, the impedance of the grounding circuit 100 may be formed of only the coil 120A.

Thus, in this embodiment, the pusher pins 70 and the second susceptor 32 are electrically connected with the line 70B. In addition, the grounding circuit 100 with a higher impedance than the RF power supply circuit 80A is provided in the impedance matching circuit 85. The grounding circuit 100 is constructed of a known impedance matching circuit.

While a plasma treatment is being performed, the RF power of the RF power supply 80 is supplied to the second susceptor 32 rather than the grounding circuit 100, thereby generating plasma between the second susceptor 32 and the upper chamber 20A, which is the opposed electrode.

On the other hand, when the plasma generation is stopped, electric charges remain in the condenser of the impedance matching circuit or the storage capacitance of the RF power supply circuit 80A. However, these electric charges are discharged through the grounding circuit 100, which grounds only a DC current. Thus, the electric charges which tend to reside on the second susceptor 32 is discharged to the ground through the grounding circuit 100. In addition, electric charges do not remain on the pusher pins 70 whose voltage is the same as that of the second susceptor 32. Thus, the potential difference does not take place between the pusher pins 70 and the susceptor 32, thereby preventing an abnormal discharging from taking place.

According to this embodiment, the pusher pins 70 are electrically connected to the second susceptor 32, which is one of the opposed electrodes. In addition, with a known construction, the grounding circuit can be formed. Thus, a residual electric charge eliminating construction can be easily formed without the need to employ a special system. In FIG. 1, when the plasma generation is stopped, by closing the switch 100A, electric charges can be discharged from the grounding circuit 100. In this case, the resistor 120 of the grounding circuit 100 can be omitted.

In this embodiment, an RIE type of plasma treatment apparatus where an RF power is supplied to one of opposed electrode was described. However, it should be noted that the present invention is not limited to such a construction. Rather, the construction of the embodiment may be modified in various manners within the scope of the present invention.

For example, the present invention may be applied to a plasma treatment apparatus where an RF power is supplied to both opposed electrodes.

FIG. 3 schematically shows the construction of such a plasma treatment apparatus. An RF power of an RF power supply 80 is supplied to an upper electrode 150 and a lower electrode 152 through an impedance matching circuit 240. A static chuck (not shown) is disposed on the lower electrode 152 so as to attract and hold a semiconductor wafer. Pusher pins 70 are electrically connected to the lower electrode 152 through a line 152A.

In this circuit construction, when blocking condensers 160, which prevent a DC current from flowing, are disposed in circuits connected to the upper and lower electrodes 150 and 152, grounding circuits 180 which discharge residual electric charges remaining in the condensers 160 are formed of resisters 170 that are grounded.

Thus, when electric charges which are enough to charge the upper and lower electrodes 150 and 152 remain in the condensers 160, the electric charges flow to the ground through the respective resistors 170. Thus, electric charges which tend to reside on the upper and lower electrodes 150 and 152 are discharged. In addition, since the voltage of the pusher pins 70 disposed on the lower electrode 152 is the same as the voltage of the lower electrode 152, an abnormal discharging between the pusher pins 70 and the lower electrode 152 can be prevented.

When residual electric charges are eliminated by resistors, the resistors of the self bias measuring circuits of the impedance matching circuit 240 not be used depending on an impedance setting condition. Alternatively, instead of the resistors, inductance coils may be used.

The mono-pole type static chuck according to the present invention may be applied to various plasma treatment apparatuses such as plasma CVD apparatuses and sputter depositing apparatuses, which supply a cold gas such as He gas between a workpiece and a static chuck so as to perform a heat transfer operation.

As described above, according to the present invention, since push-up members and an opposed electrode are electrically connected, the voltage of the push-up members becomes equal to the voltage of the opposed electrode. A grounding circuit that discharges electric charges, which tend to reside on an opposed electrode, to an RF power supply line connected to the opposed electrode can be formed of an existing construction. Thus, electric charges that tend to reside on an opposed electrode can be eliminated without the need to provide a special construction. In addition, since the opposed electrode and the push-up members are electrically connected, the voltage of the opposed electrode is equal to the voltage of the push-up members, an abnormal discharging caused by potential difference can be completely prevented.

Second Embodiment

Next, with reference to FIGS. 4 to 6, a second embodiment of the present invention will be described.

First, with reference to FIGS. 4 and 5, a construction of a plasma treatment apparatus will be described.

Figure 4:
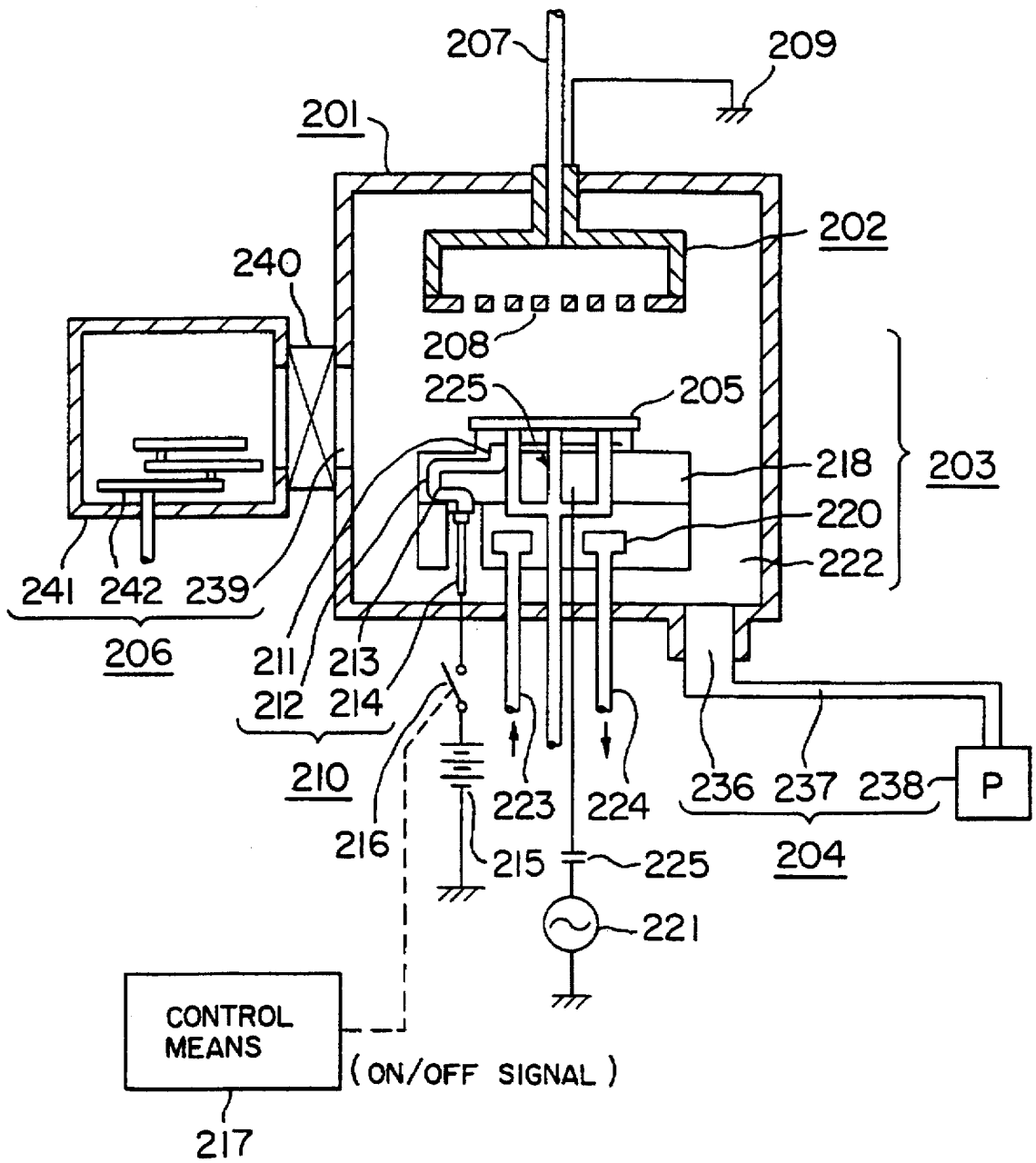
FIG. 4 is a sectional view schematically showing a plasma treatment apparatus according to a second embodiment of the present invention.

As shown in FIG. 4, the plasma treatment apparatus comprises an air-tight chamber 201, an upper electrode 202, a lower electrode 203, an exhaust system 204, and a loading/unloading system 206. The chamber 201 houses the upper electrode 202, the lower electrode 203, the exhaust system 204, the loading/unloading system 206. The upper electrode 202 and the lower electrode 203 generate plasma. The exhaust system 204 reduces the pressure in the chamber 201. The loading/unloading system 206 loads and unloads a workpiece, for example, a semiconductor wafer 205 to and from the chamber 201.

At least an inner wall of the chamber 201 is made of a conductor such as aluminum. The surface of the inner wall is treated with aluminum oxide. A heating means such as a heater is disposed in the inner wall of the chamber 201. The heating means prevents a chemical product produced from a treatment gas and plasma from adhering to the inner wall of the chamber 201. The heating temperature of the heating means can be varied in the range from 50° C. to 100° C.

The upper electrode 202 is disposed at an inner upper position of the chamber 201. One end of the upper electrode 202 air-tightly penetrates an upper portion of the chamber 201 and is connected to a gas supply pipe 207 through which a treatment gas such as $CHF_3$ or $CF_4$ or an inert gas such as $N_2$ gas is supplied to the chamber 201. The other end of the upper electrode 202 has a plurality of gas delivering openings 208. The gas delivering openings 208 are radially disposed and deliver the treatment gas supplied from the gas supply pipe 207 toward the semiconductor wafer 205. The upper electrode 202 is electrically grounded by a line 209.

The lower electrode 203 is opposed to the upper electrode 202. The lower electrode 203 is provided with a susceptor 218 and a static chuck 210. The static chuck 210 statically attracts and holds the semiconductor wafer 205.

Figure 5:
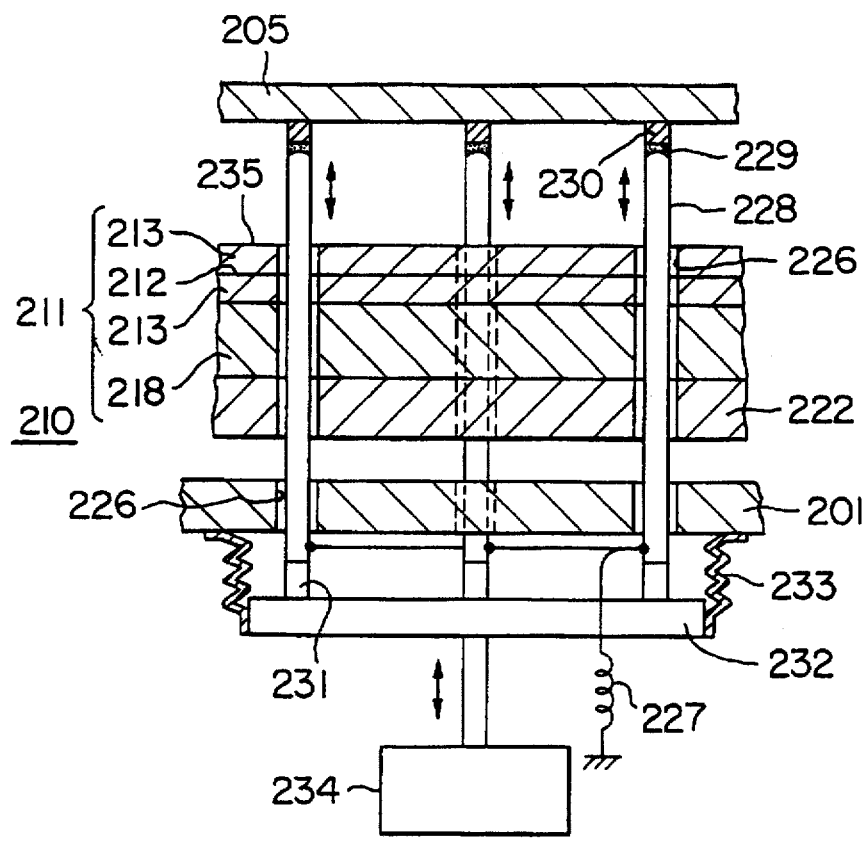
FIG. 5 is a sectional view schematically showing an operation for attaching and detaching a workpiece to and from a static chuck of FIG. 4.

The static chuck 210 is provided with a static chuck sheet 211 serving as a holding portion that attracts and holds as best seen in FIG. 5, the semiconductor wafer 205. The static chuck sheet 211 is formed of an electrolytic copper foil 212 as a center layer and two insulation films 213 as outer layers. Both the surfaces of the electrolytic copper foil 212 are adhered to the insulation films 213 with a polyimide type adhesive agent. Thus, the electrolytic copper foil 212 is sandwiched by the insulation films 213.

The electrolytic copper foil 212 is connected to a feeding rod 214. The feeding rod 214 applies a high voltage ranging, for example, from 200 V to 3 kV to the electrolytic copper foil 212. The feeding rod 214 air-tightly and insulatedly penetrates the bottom of the chamber 201 and is connected to a high voltage power supply 215 through a switching means such as a solenoid switch 216.

The solenoid switch 216 is turned on or off corresponding to a control signal received from a control means 217.

The susceptor 218, which is disposed at a lower portion of the static chuck sheet 211, is made of a conductive material such as aluminum. The susceptor 218 is connected to a radio frequency power supply (RF power supply) 221 through a blocking condenser 225. The RF power supply 221 supplies a power with a high frequency of for example 13.56 MHz or 40 MHz.

A susceptor support table 222 is disposed at a lower portion of the susceptor 218. A coolant reservoir 220 is disposed in the susceptor support table 222. The coolant reservoir 220 stores a coolant such as liquified nitrogen, which cools the semiconductor wafer 205 to a temperature ranging from −30° C. to −150° C. The coolant reservoir 220 is connected to a coolant delivering pipe 223 and a coolant drainage pipe 224. The coolant delivering pipe 223 delivers liquified nitrogen to the coolant reservoir 220. The coolant drainage pipe 224 drains $N_2$ gas, which has been vaporized from the liquified nitrogen, from the coolant reservoir 220.

The susceptor 218, the susceptor support table 222, and the static chuck sheet 211 have a heat transmitting medium supply path 225. The heat transmitting medium supply path 225 supplies a heat transmitting medium such as an inert gas (for example, He gas) that transmits the temperature of the coolant reservoir 220 to the semiconductor wafer 205 through the static chuck sheet 211.

As shown in FIG. 5, a plurality of (for example, three) through-holes 226 that pierce the susceptor 218, the susceptor support table 222, the static chuck sheet 211, and the bottom of the chamber 201 are formed in the lower electrode 203. Support pins (pusher pins) 228 that are made of a conductive material and electrically grounded through an inductance 227 are inserted into the respective through-holes 226. The support pins 228 are in contact with the semiconductor wafer 205 through respective conductive rubber members 230. The conductive rubber members 230 are adhered to the respective support pins 228 with a conductive adhesive agent 229 that is an epoxy type adhesive agent containing for example a silver type conductive filler. The hardness of the conductive rubber members 230 is lower than the hardness of the semiconductor wafer 205. The conductive rubber members 230 are made of for example a silicon conductive rubber or NBR conductive rubber.

The support pins 228 are secured to a support pin support table 232 through respective insulating members for example ceramics members 231. An air-tight, elastic bellows member 233 is disposed between an outer peripheral portion of the support pin support table 232 and a bottom portion of the chamber 201. The support pin support table 232 is connected to a lifting drive means for example an air cylinder 234 which lifts up and down the support pins 228. As the air cylinder 234 vertically moves, the support pin support table 232 and the support pins 228 vertically move. Thus, a semiconductor wafer attaching/detaching means which attaches and detaches the semiconductor wafer 205 onto and from a holding surface 235 of the static chuck sheet 211 is formed.

As shown in FIG. 4, the exhaust system 204 has a gas exhaust opening 236 that serves to lower the pressure in the chamber 201. The gas exhaust opening 236 is disposed at a bottom portion of the chamber 201. The gas exhaust opening 236 is connected to a vacuum exhaust unit 238, for example a turbo-molecular pump, through an exhaust pipe 237.

The loading/unloading system 206 has a loading/unloading opening 239, through which a semiconductor wafer 205 is loaded and unloaded. The loading/unloading opening 239 is defined in a side wall of the chamber 201. The loading/unloading opening 239 is opened and closed by a gate valve 240. A load lock chamber 241 is opposed to the chamber 201 with the gate valve 240 therebetween. A loading/unloading arm 242 is disposed in the load lock chamber 241. The loading/unloading arm 242 loads and unloads a semiconductor wafer 205 to and from the chamber 201.

Next, the plasma treatment apparatus with the above-described construction (according to the second embodiment) will be described.

The semiconductor wafer 205 held by the loading/unloading arm 242 is moved to a position over the static chuck sheet 211 in the chamber 201. The semiconductor wafer 205 is transferred to the support pins 228. The support pins 228 are lowered by the air cylinder 234. The semiconductor wafer 205 is placed on the holding surface 235 of the static chuck sheet 211.

Before the semiconductor wafer 205 is placed on the holding surface 235 of the static chuck sheet 211, the switch 216 is closed and the predetermined high voltage is applied to the electrolytic copper foil 212 of the static chuck sheet 211. Thus, as shown in FIG. 6, the front surface of the semiconductor wafer 205 is charged with minus electric charges 242, whereas the holding surface of the static chuck sheet 211 is charged with plus electric charges 243. The plus electric charges 243 and minus electric charges 242 result in a static attracting force. The static attracting force causes the semiconductor wafer 205 to be attracted and held on the holding surface 235 of the static chuck sheet 211.

The predetermined treatment gas, for example He gas, is supplied to the chamber 201 through the gas delivering openings 208. Thus, the inside of the chamber 201 is kept at a predetermined pressure. The He gas is supplied to the entire rear surface of the semiconductor wafer 205 through the heat transmitting medium supply path 225. A treatment power of for example 500 W to 2 kW is supplied from the radio frequency power supply 221 to the semiconductor wafer 205. Thus, plasma is generated between the upper electrode 202 and the semiconductor wafer 205. With the plasma, an etching treatment is performed for the semiconductor wafer 205. When the plasma is generated, the semiconductor wafer 205 is temporarily grounded. Thus, the semiconductor wafer 205 is strongly attracted to the holding surface 235 of the static chuck sheet 211.

Next, the operation for detaching the semiconductor wafer 205 from the holding surface 235 of the static chuck sheet 211 will be described. The He gas supplied to the entire rear surface of the semiconductor wafer 205 from the heat transmitting medium supply path 225 is stopped. The switch 216 is opened so as to stop the high voltage applied to the electrolytic copper foil 212 of the static chuck sheet 211.

Figure 6:
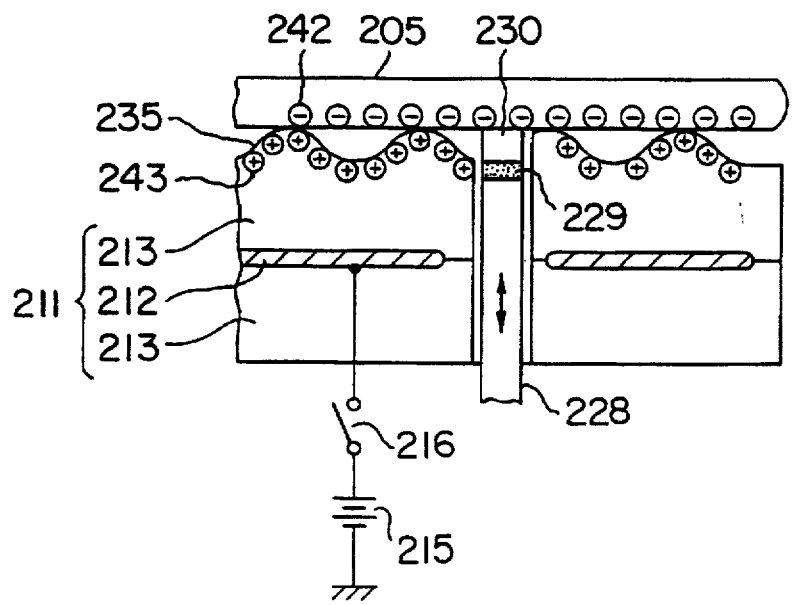
FIG. 6 is a partial sectional view showing an eliminating operation of residual electric charges that reside on the workpiece and the static chuck of FIG. 4.

Next, as shown in FIG. 6, the support pins 228 are raised by the air cylinder 234 so that the conductive rubber members 230 on the support pins 228 are in contact with the rear surface of the semiconductor wafer 205. Thus, the minus residual electric charges 242 charged on the front surface of the semiconductor wafer 205 flow to the support pins 228, which are electrically grounded, through the conductive adhesive agent 229. The plus residual electric charges 243 charged on the holding surface 235 of the static chuck sheet 211 flow to the support pins 228, which are electrically grounded, through the semiconductor wafer 205.

After the minus residual electric charges 242 and the plus residual electric charges 243 are grounded and eliminated, the support pins 228 are raised by the air cylinder 234 so as to detach the semiconductor wafer 205 from the holding surface 235 of the static chuck 211.

Next, the effects of the second embodiment will be described.

The residual electric charged on the semiconductor wafer 205 and the residual electric charges charged on the semiconductor wafer holding surface 235 of the static chuck sheet 211 freely flow to the support pins 228, which are in contact with the rear surface of the semiconductor wafer 205 and are electrically grounded. Thus, these residual electric charges are eliminated. Since electric charges are eliminated as much as possible, when the semiconductor wafer 205 is raised from the holding surface 232 of the static chuck sheet 211, the rear surface of the semiconductor wafer 205 is not attracted by the residual electric charges. Thus, the semiconductor wafer 205 is detached from the holding surface 232 of the static chuck sheet 211 in such a way that it is kept flat rather than skewed.

Since the conducive rubber members which are brought into contact with the rear surface of the semiconductor wafer 205 have a lower hardness than that of the semiconductor wafer 205, the rear surface of the semiconductor wafer 205 is not damaged. When the contacting characteristics of the conductive rubber members are improved and the substantial contacting area thereof is increased, the residual charges charged on the semiconductor wafer 205 and the residual charges charged on the holding surface 235 of the static chuck sheet 211 may be more eliminated.

In the second embodiment, the conductive rubber members were adhered to the support pins with a conductive adhesive agent. However, it should be noted that the conductive rubber members may be fitted to the support pins. In the second embodiment, a plasma etching apparatus was described. However, it should be appreciated that the present invention is not limited to such a plasma etching apparatus. Rather, the present invention may be applied to apparatuses that treat a workpiece with plasma as in CVD and LCD, apparatuses that transfer a workpiece with a static chuck, and so forth.

According to the present invention, since residual electric charges charged on the workpiece holding surface of the static chuck and residual electric charges charged on the workpiece can be securely eliminated, the workpiece can be detached from the holding surface of the static chuck by the support pins while the workpiece is kept horizontal. Thus, the workpiece can be safely detached rather than skewed.

The pins having the conductive rubber members according to the second embodiment can be applied to the pusher pins according to the first embodiment.

Third Embodiment

Next, with reference to FIGS. 7 to 14B, a third embodiment of the present invention will be described.

FIG. 7 is a sectional view showing a construction of principal portions of a magnetron plasma treatment apparatus according to the third embodiment of the present invention. In FIG. 8, reference numeral 310 is a magnetron plasma treatment apparatus. The magnetron plasma treatment apparatus 310 comprises a load lock chamber 392, an unload chamber 394, and a process chamber 320. The process chamber 320 is disposed between the load lock chamber 392 and the unload chamber 394. As shown in FIG. 7, the chamber 320 that serves as an upper electrode houses a first susceptor 330, a second susceptor 332, and a static chuck 340 that serve as a lower electrode. A magnet 350 is disposed outside the chamber 320 in such a way that they are spaced apart from each other. The magnet 350 produces a rotating magnetic field that is in parallel with the workpiece.

The chamber 320 is constructed of a cylindrical upper chamber 320A and a cylindrical lower chamber 320B. The bottom of the upper chamber 320 is open. The lower chamber 320B is secured to a lower portion of the upper chamber 320. The upper chamber 320 and the lower chamber 320B form a space in which a vacuum is created and the space is filled with an etching gas. A cylindrical heat insulator 322 is disposed inside the lower chamber 320B. The cylindrical heat insulator 322 has a bottom and is made of ceramics.

The first susceptor 330 and the second susceptor 332 are disposed in the heat insulator 322.

The first susceptor 330 and the second susceptor 332 are layered and made of a conductor such as aluminum, which conducts electricity and heat. In such a separate construction, the first susceptor 330, which is disposed above the second susceptor 332, can be replaced with another one corresponding to the size of the semiconductor wafer 360, which is a workpiece. A cooling jacket 332A is formed in an outer peripheral portion of the second susceptor 332. A semiconductor wafer 360, which is a workpiece, is cooled at around −50° C. to −100° C. by a coolant that circulates in the cooling jacket 332A through the first susceptor 330 and the static chuck 340.

The static chuck 340 is fixedly placed on the front surface of the first susceptor 330. The static chuck 340 is formed of two outer insulation layers and an inner conductive layer which is made of for example copper. The static chuck 340 attracts and holds a workpiece 360 such as a semiconductor wafer with Coulomb's force. A space defined by the front surface of the first susceptor 330 and the opposed static chuck 340 is filled with a heat transmitting gas. With this gas, even if the static chuck 340 does not evenly fit to the first susceptor 330, the static chuck 340 can be cooled. Pusher pins 370 penetrate the first susceptor 330, the second susceptor 332, and the static chuck 340. The pusher pins 370 push up and down the workpiece 360, thereby detaching and attaching the workpiece 360 from and to the static chuck 340.

In FIG. 8, the chamber 320, which is constructed of the upper chamber 320A and the lower chamber 320B, is connected to a scanning chamber 390 along with the load lock chamber 392 and the unload chamber 394. The scanning chamber 390 is provided with a probe 380 which moves to and retreats from plasma generated between the opposed electrodes in the chamber 320. The probe 380 measures I-V characteristics of the plasma so as to scan a generated condition thereof. The scanned result of the probe 380 is sent to a control device that will be described later. The probe 380 is disposed, for example, at a distal end of a movable arm 391. As shown in FIG. 9, the position and height of the probe 380 are set so that the probe 380 is positioned in plasma P adjacent to plasma sheath D. The probe 380 is preferably place at a position spaced apart by 5 mm or less from the plasma sheath D. Thus, the probe 380 is placed at a position where the electron density of the plasma is the highest which is denoted by a two-dashed line of FIG. 9.

According to the third embodiment, the upper chamber 320A, which serves as the opposed electrode, and the first susceptor 320, which serves as the lower electrode, are connected to an RF power supply circuit of an RF power supply (radio frequency power supply).

Figure 10:
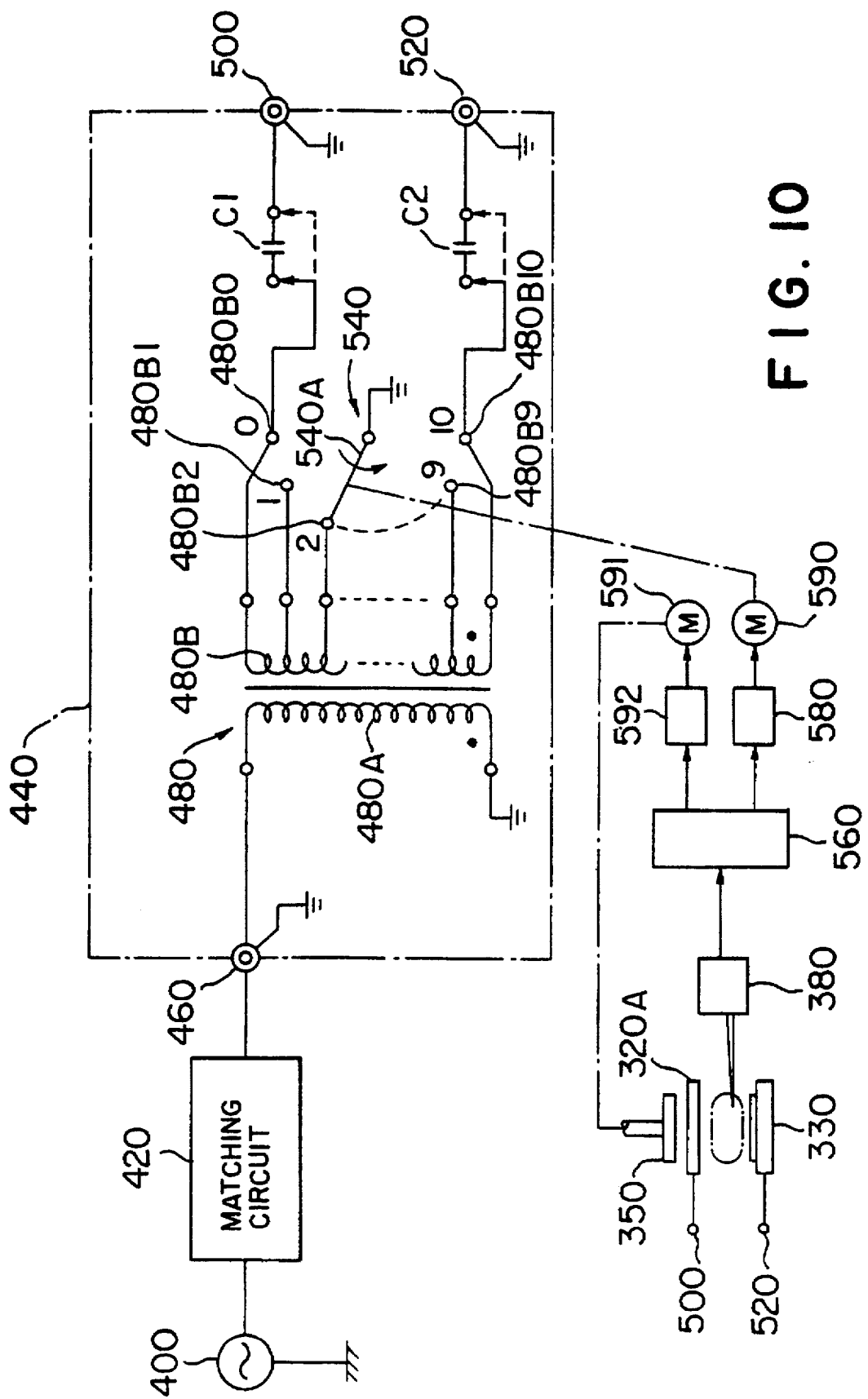
FIG. 10 is a circuit diagram for explaining a construction of principal portions of an RF power supply circuit for use with the principal portions of FIG. 7.

FIG. 10 shows a feeding portion constructed of an RF power supply circuit. In FIG. 10, one of output terminals of the RF power supply 400 is grounded, whereas the other terminal is connected to an input terminal of a power distributing means 440 through a matching circuit 420.

The matching circuit 420 matches an output inductance of the power supply side with an input impedance of the upper electrode and the lower electrode. The power distributing means 440 has a transformer 480. The transformer 480 has a primary coil 480A and a secondary coil 480B which are insulated from each other. One end of the primary coil 480A is connected to the input terminal 460, and the other end of the primary coil 480A is grounded. A plurality of intermediate terminals are provided between both end terminals 480B0 and 480B10 of the secondary coil 480B. The end terminals 480B0 and 480B10 are connected to output terminals 500 and 520 through condensers C1 and C2, respectively. The output terminals 500 and 520 are connected to the upper chamber 320 A on the upper electrode side and the first susceptor 330 on the lower electrode side, respectively.

The power distributing means 440 sets a power distributing ratio of the Z power to the upper electrode and the lower electrode. The power distributing means 440 is provided with a power splitter 540 that varies the power distributing ratio.

In other words, as described above, the secondary coil 480B has the intermediate tap terminals 480B1 to 480B9 where the entire turns of the secondary coil 480B are divided by 10. One of the intermediate tap terminals 480B1 to 480B9 is connected to a variable terminal 540A so as to change the power distributing ratio of the RF power to the upper electrode and the lower electrode.

The connection of the variable terminal 540A to one of the intermediate tap terminals 480B1 to 480B9 is controlled by a control device 560 that will be described later.

An input terminal of the control device 560 is connected to the probe 380. Output terminals of the control device 560 are connected to drive devices 580 and 592. The drive portion 580 drives a stepping motor 590 which moves the variable terminal 540A. The drive device 592 drives a motor 591 which rotates the magnet 350.

The control device 560 detects the condition of plasma with the I-V characteristics received from the probe 380 and controls the power distributing ratio of the RF power to the opposed electrodes so as to set the plane equality of the workpiece. Thus, the control device 560 detects plasma parameters, which are at least plasma voltage, ion current, and electron temperature, and compares these plasma parameters with reference values for the plane equality. When there is a deviation between the plasma parameters and the reference values, the control device 560 sets the power distributing ratio of the RF power to the upper and lower electrodes, so that the plasma parameters match with the reference values for the plane equality. In this case, a model that represents the relation between plasma parameters and an optimum value of the power distributing ratio for the plane equality may have been input to the control portion 560. According to the model, the power distributing ratio may be set. Thus, even if the plasma parameters vary due to electrons which flow from one electrode toward the inner wall of the chamber as well as between the opposed electrodes, the plasma parameters can be corrected.

When the plasma condition is scanned by the probe 380, the control portion 560 performs the following operation.

When the plasma condition is scanned, the rotation of the magnet 350 is stopped so as to fix the orientation of the magnetic field. In other words, when the magnet 350 is rotated, the direction of the lines of magnetic force varies and thereby the direction of electrons that flow also varies. Thus, the plasma rotates and thereby the probe 380 deviates from the predetermined position of the plasma. Consequently, the orientation of the magnetic field should be fixed.

In addition, a plurality of rotation stop positions are set. In other words, when the orientation of magnetic field is changed while the workpiece is fixed, as the plasma rotates, the opposed position of the plasma against the workpiece varies. With such a phenomenon, while the workpiece 360 and the probe 380 are fixed, only the plasma is rotated. While the plasma is being rotated, when the magnet 350 is stopped, the opposed position of the plasma against the workpiece 360 can be changed. For example, when the plane of the workpiece 360 is broken down into north, west, south, and east regions and the rotation stop positions of the magnet are set every 45 degrees, a plurality of peripheral opposed positions of the plasma against the workpiece 360 can be set. This means that the scanning operation is performed by the probe 380 at a plurality of positions.

Next, the operation of the third embodiment will be described.

In this embodiment, a condition of plasma is scanned with a dummy wafer as a workpiece before the plasma treatment is performed. In other words, the dummy workpiece is attracted and held by the static chuck 340. A vacuum is created in the chamber 320. Thereafter, the chamber 320 is filled with a plasma gas. The RF power is supplied to the upper chamber 320A and the first susceptor 330 so as to generate the plasma between the electrodes. While the plasma is being generated,the scanning chamber 390 is connected to the chamber 320 and the probe 380 is placed in the predetermined position so as to scan the condition of the plasma. At this point, the rotation of the magnet 350 is stopped and thereby the orientation of magnetic field is fixed. When the power distributing ratio of the RF power to the electrodes is alternately changed between 100:0 and 0:100, two portions with high electron density are formed at two radial end positions of the workpiece. Thus, the scanning on the plane of the workpiece can be simulated.

The I-V characteristics of the plasma, which are detected by the probe 380, are input to the control device 560. The control device 560 determines the plasma condition by comparing the detected parameters with the reference values. If the control device 560 determined that proper plasma has not been generated, the control device 560 sets the power distributing ratio corresponding to the deviation. Thus, the power distributing means 440 sets the amount of rotations of the stepping motor 590 corresponding to the power distributing ratio set by the control device 560 so as to determine the contact position of the variable terminal 540A.

When the power distributing ratio of the RF power to the opposed electrodes is changed, even if plasma cannot be stably generated due to variation of movement of electrons corresponding to variation of pressure of atmospheric gas, the plasma can be stably generated.

When a condition of plasma is scanned at a plurality of positions of a dummy wafer for example, a workpiece, the dummy wafer is attracted and held by the static chuck 340. The magnet 350 is rotated for e.g. 45 degrees from the last scanning position. At each stop position of the magnet 350, the probe 380 is placed at a predetermined position of the plasma so as to scan the condition of plasma. Thereafter, the above-mentioned control is performed.

In the third embodiment, a magnetron plasma treatment apparatus where a magnet is disposed outside an upper electrode with a space was described. However, the present invention is not limited to such a construction. Rather, a cathode electrode and a magnetic field generator may be disposed in a reaction chamber.

The magnet may be an electric magnet rather than a permanent magnet.

As described above, in the plasma treatment apparatus according to the present invention, the power supply condition of the opposed electrodes, which generate plasma, is set by scanning the plasma condition with a dummy workpiece. Thus, the power supply condition of the opposed electrodes is adjusted so that plasma is stably generated. As a result, the plane equality of the workpiece can be accomplished by generating stable plasma.

According to the present invention, since a plurality of rotation stop positions of the magnet is set, even if a workpiece is held at a fixed position, the plasma condition can be scanned at these positions. Thus, the stability of plasma can be precisely controlled so as to improve the plane equality of the workpiece.

Next, with reference to FIGS. 11 to 14B, another embodiment will be described.

In the third embodiment, the power distributing ratio of the RF power to the upper and lower electrodes was changed by the control device 560 corresponding to plasma parameters detected by the probe 380. However, it should be noted that the present invention is not limited to such a construction. Instead, as shown in FIG. 11, in a plasma treatment apparatus having a transformer coupled plasma (TCP) type coil 600 as a plasma generating means connected to a power supply 610, the number of the effective turns, effective coil region, or effective coil interval of the TCP type coil 600 may be changed corresponding to a signal received from a control device 560.

Figure 12:
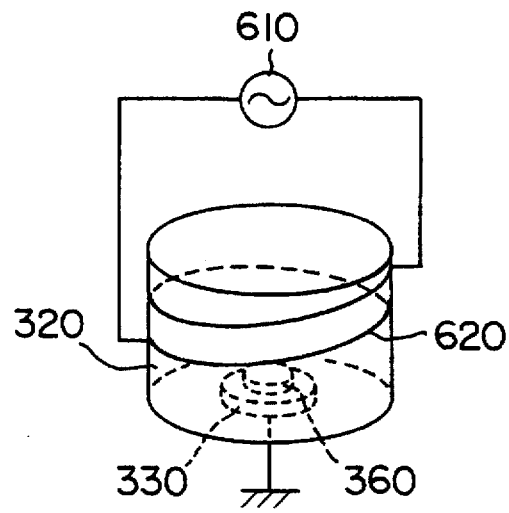
FIG. 12 is a schematic diagram showing an ICP type plasma treatment apparatus.

As show in FIG. 12 in a plasma treatment apparatus having an inductively coupled plasma (ICP) type coil 620 as a plasma generating means connected to a power supply 610, the number of the effective turns, effective coil region, or effective coil interval of the ICP type coil 620 may be changed corresponding to a signal received from a control portion 560.

Figure 11:
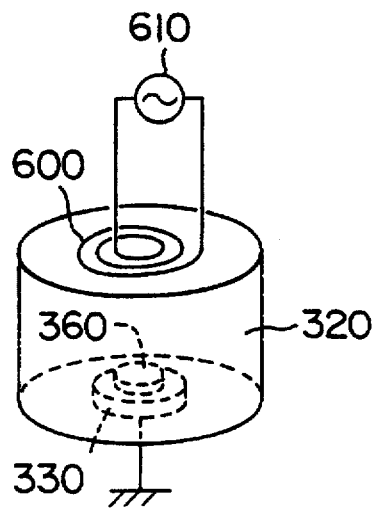
FIG. 11 is a schematic diagram showing a TCP type plasma treatment apparatus.

In FIGS. 11 and 12, a susceptor on which a semiconductor wafer 360 is placed may be grounded. The susceptor 330 may be connected to a power supply that is grounded through a condenser.

Figure 13A:
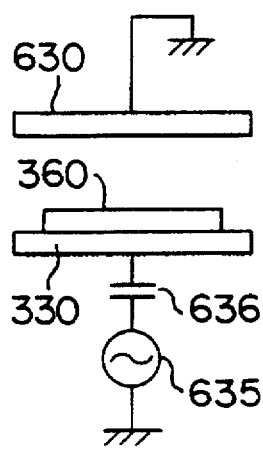
FIG. 13A is a schematic diagram showing a plasma treatment apparatus having opposed electrodes.
Figure 13B:
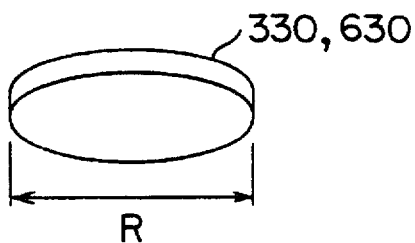
FIG. 13B is a schematic diagram showing one of the opposed electrodes of FIG. 13A.

As shown in FIGS. 13A and 13B, in a plasma treatment apparatus having a lower electrode (susceptor) connected to a power supply 635 grounded through a condenser 636, the effective radius R (namely effective area) of each of an upper electrode 630 and a lower electrode 330 may be changed corresponding to a signal received from a control device 560.

Figure 14A:
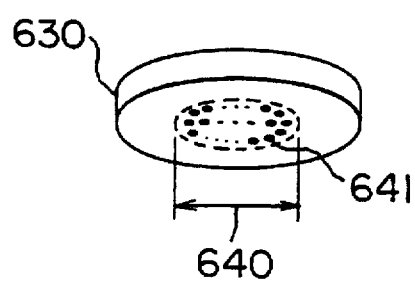
FIG. 14A is a perspective view schematically showing an upper electrode having treatment gas supply paths.
Figure 14B:
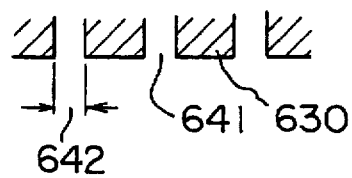
FIG. 14B is a side sectional view showing an upper electrode having a treatment gas supply path.

As shown in FIGS. 14A and 14B, in a plasma treatment apparatus having an upper electrode 630 with many treatment gas delivering paths 641, a diameter 642 of each of the treatment gas delivering paths 641 may be changed by valves or the like corresponding to a signal received from a control device 560, so as to change the effective disposition area 640 of the treatment gas delivering paths or the effective sectional area.

The construction where the power distributing ratio, the number of the effective turns, the effective coil region, and the effective coil interval of each of the coils 600 and 620, the effective area of each of the lower electrode 630 and the lower electrode 330, and the effective disposition region or the effective sectional area of the treatment gas delivering paths 641 are changed by the control device 560 corresponding to plasma parameters detected by the probe 380 may be applied to the first embodiment. Each control item may be changed by the control device 560 for each semiconductor wafer or for each a plurality of semiconductor wafers.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A plasma treatment apparatus, comprising:

a chamber;

plasma generating means for generating plasma in said chamber;

a workpiece-side electrode disposed in said chamber, for holding a workpiece;

a pin straightly penetrating said workpiece-side electrode, after a treatment is completed, said pin being in contact with said workpiece so as to detach said workpiece from said workpiece-side electrode; and a conductive rubber member disposed at the distal end of said pin, said conductive rubber member having a lower hardness than said workpiece.

2. The plasma treatment apparatus as set forth in claim 1, wherein said conductive rubber member is made of silicon rubber.

3. A plasma treatment apparatus, comprising:

a chamber;

plasma generating means for generating plasma in said chamber;

a workpiece-side electrode, disposed in said chamber, for holding a workpiece;

a conductive pin straightly penetrating said workpiece-side electrode, after a treatment is completed, said pin being in contact with said workpiece so as to detach said workpiece from said workpiece-side electrode;

a connecting circuit electrically connecting said pin to said workpiece-side electrode;

a grounding circuit electrically connected to said workpiece-side electrode; and a conductive rubber member fixed to an end of said pin, said conductive rubber member having a lower hardness than said workpiece.

4. The plasma treatment apparatus as set forth in claim 3, wherein:

said conductive rubber member is made of silicon rubber.

5. The plasma treatment apparatus as set forth in claim 3, further comprising:

a switch disposed between said workpiece-side electrode and said grounding circuit.

6. The plasma treatment as set forth in claim 3, further comprising:

a power supply circuit connected to said workpiece-side electrode, wherein the impedance of said grounding circuit is at least 10 times as high as the impedance of said power supply circuit.

7. The plasma treatment apparatus as set forth in claim 3, further comprising:

a static chuck disposed on said workpiece-side electrode, for electrically attracting and holding said workpiece.

8. The plasma treatment apparatus as set forth in claim 3, further comprising:

a mechanical chuck disposed on said workpiece-side electrode, for mechanically holding said workpiece.

9. The plasma treatment apparatus as set forth in claim 3, wherein:

said plasma generating means has opposed electrodes, and said workpiece-side electrode is one of said opposed electrodes.

10. The plasma treatment apparatus as set forth in claim 3, further comprising:

magnetic field generating means disposed outside said chamber, for generating a rotating magnetic field.

11. The plasma treatment apparatus as set forth in claim 3, wherein:

said plasma generating means is a transformer coupled plasma type having a transformer coupled plasma type coil.

12. The plasma treatment apparatus as set forth in claim 3, wherein:

said plasma generating means is an inductively coupled type having a inductively coupled plasma type coil.

13. A plasma treatment method for discharging electric charges remaining in a workpiece by using a plasma treatment apparatus comprising:

providing a chamber;

generating plasma in said chamber by a plasma generating means;

holding a workpiece with a workpiece-side electrode disposed in said chamber; and penetrating straightly said workpiece-side electrode with a conductive pin, after a treatment is completed, said conductive pin being in contact with said workpiece so as to detach said workpiece from said workpiece-side electrode, wherein said conductive pin is electrically connected to said workpiece-side electrode, wherein said workpiece-side electrode is connected to a grounding circuit, and wherein a conductive rubber member is disposed at a forward end of said pin, said conductive rubber member having a lower hardness than said workpiece.

* * * * *